United States Patent
Jeon et al.

(10) Patent No.: US 7,800,158 B2
(45) Date of Patent: Sep. 21, 2010

(54) SEMICONDUCTOR DEVICE AND METHOD OF FORMING THE SAME

(75) Inventors: Hee-Seog Jeon, Suwon-si (KR); Jeong-Uk Han, Suwon-si (KR); Chang-Hun Lee, Suwon-si (KR); Sung-Taeg Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 874 days.

(21) Appl. No.: 11/600,499

(22) Filed: Nov. 16, 2006

(65) Prior Publication Data

US 2007/0126048 A1    Jun. 7, 2007

(30) Foreign Application Priority Data

Nov. 17, 2005    (KR) .................. 10-2005-0109998

(51) Int. Cl.
  *H01L 31/032*    (2006.01)
(52) U.S. Cl. .................. 257/316; 257/416; 257/900
(58) Field of Classification Search .............. 257/316, 257/900, 416
  See application file for complete search history.

(56) References Cited

U.S. PATENT DOCUMENTS

| | | | |
|---|---|---|---|
| 5,607,871 A | 3/1997 | Han | |
| 5,918,214 A | 6/1999 | Perkowski | |
| 6,140,182 A * | 10/2000 | Chen | 438/259 |
| 6,703,662 B1 * | 3/2004 | Koishikawa | 257/316 |
| 6,784,476 B2 * | 8/2004 | Kim et al. | 257/296 |
| 6,784,933 B1 * | 8/2004 | Nakai | 348/302 |
| 7,265,411 B2 * | 9/2007 | Kang | 257/317 |
| 2002/0100926 A1 | 8/2002 | Kim et al. | |
| 2002/0123194 A1 | 9/2002 | Cho | |
| 2005/0169052 A1 | 8/2005 | Hsu et al. | |
| 2006/0076607 A1 | 4/2006 | Kang | |

FOREIGN PATENT DOCUMENTS

| | | |
|---|---|---|
| JP | 11-330279 | 11/1999 |
| JP | 2001-176990 | 6/2001 |
| KR | 10-0142601 | 4/1998 |
| KR | 10-2000-0039091 | 7/2000 |
| KR | 2002-0064016 | 8/2002 |
| KR | 10-0598047 B1 | 6/2006 |
| WO | 00/51188 | 8/2000 |

* cited by examiner

*Primary Examiner*—Howard Weiss
*Assistant Examiner*—Steven H Rao
(74) *Attorney, Agent, or Firm*—Mills & Onello LLP (57) ABSTRACT

There is provided a semiconductor device and a method of forming the same. The semiconductor device includes a memory device and a self-aligned selection device. A floating junction is formed between the self-aligned selection device and the memory device.

16 Claims, 11 Drawing Sheets

Fig. 1

(PRIOR ART)

SEMICONDUCTOR DEVICE AND METHOD OF FORMING THE SAME

RELATED APPLICATIONS

This application relies for priority on Korean Patent Application number 10-2005-0109998, filed in the Korean Intellectual Property Office on Nov. 17, 2005, the contents of which are incorporated herein in their entirety by reference.

BACKGROUND OF THE INVENTION

1. Field of the Invention

The present invention relates to a semiconductor device and a method of forming the same, and more particularly, to a nonvolatile memory device and a method of forming the same. Further, the invention relates to an electrically erasable and programmable read only memory (EEPROM) device in various types of non-volatile memory devices retaining data even when a power source is cut off, and a method of forming the same.

2. Description of the Related Art

The semiconductor memory device can be largely classified into a random access memory (RAM) and a read only memory (ROM). The RAM is a volatile memory device in which stored data disappears when a power supply is interrupted. The ROM is a nonvolatile memory device in which stored data is retained even if the power supply is interrupted. The ROM includes an EEPROM device capable of electrically programming and erasing information.

Figure 1:
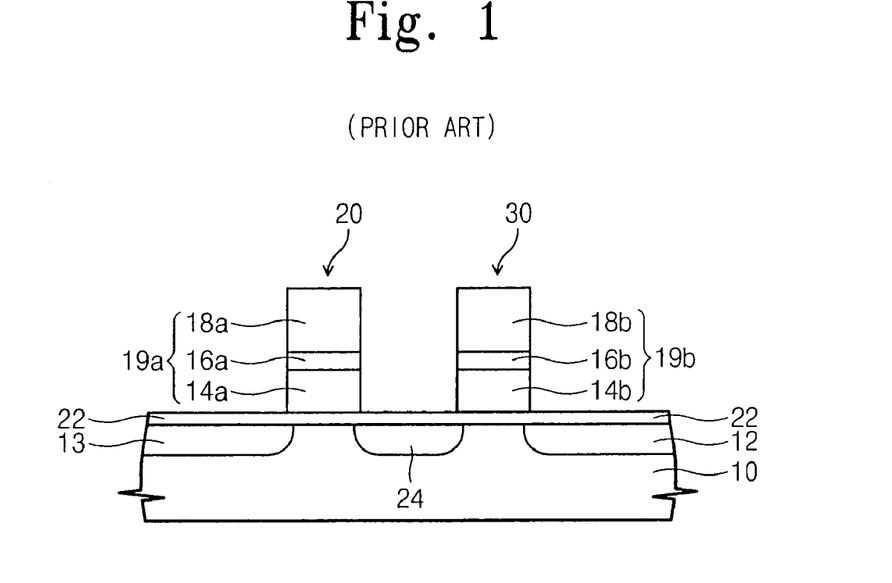
FIG. 1 is a sectional view of a semiconductor with a non-volatile memory device and a selection device according to related art.

FIG. 1 is a sectional view of a related art EEPROM in which a unit cell includes a non-volatile memory device and a selection device. In the related art EEPROM, a memory device 20 and a selection device 30 have stacked gate structures 19a and 19b, respectively. That is, the stacked gate structure 19a of the memory device 20 includes a floating gate 14a, an inter-gate insulation layer 16a, and a control gate 18a sequentially stacked on a substrate 10 having a silicon oxide layer 22 formed thereon. Likewise, the stacked gate structure 19b of the selection device 30 includes a bottom electrode 14b, an inter-gate insulation layer 16b, and a top electrode 18b sequentially stacked on the substrate 10 having the silicon oxide layer 22. In the stacked gate structure 19b of the selection device 30, the top electrode 18b and the bottom electrode 14b are electrically connected to each other by a butting contact. A floating junction 24 is formed in the substrate 10 between the stacked gate structure 19a of the memory device 20 and the stacked gate structure 19b of the selection device 30 to connect the memory device 20 and the selection device 30. A drain region 13 of the memory device 20 is formed as a bit line junction at a side of the stacked gate structure 19a opposite to the floating junction 24. Additionally, a source region 12 is formed as a source junction of the selection device 30 at a side of the stacked gate structure 19b opposite to the floating junction 24. In the memory device 20, programming and erasing may be performed using Fowler-Nordheim (FN) tunneling. The selection device 30 is formed to select a memory device or to prevent over-erasing of the memory device.

In a manufacturing process of the related art EEPROM, a silicon oxide layer, a polysilicon layer, an inter-gate insulation layer, and a polysilicon layer are sequentially stacked on the substrate 10. Then, photolithography is performed to form the stacked gate structures 19a and 19b, which are spaced apart from each other. An ion implantation process is performed to form the floating junction 24 between the stacked gate structures 19a and 19b, and to form the drain region 13 and the source region 12 outside the stacked gate structure.

In the related art EEPROM structure, the distance between the memory device 20 and the selection device 30 is determined by the resolution of photolithography equipment. Accordingly, there is a limitation in reducing a unit cell size. Additionally, unlike in the stacked gate structure 19a of the memory device 20, it is necessary to connect electrically the bottom electrode 14b and the top electrode 18b in the stacked gate structure 19b of the selection device 30. To accomplish this, a butting contact process is required which limits reducing the chip size and complicates the overall fabrication.

SUMMARY OF THE INVENTION

Exemplary embodiments of the present invention provide a semiconductor device of which size can be reduced by a self-alignment method, and a method of forming the same.

Exemplary embodiments of the present invention also provide a semiconductor device having a gate of the selection device formed by the self-alignment method, and a method of forming the same.

Exemplary embodiments of the present invention also provide an EEPROM in which a unit cell includes one non-volatile memory device and at least one selection device.

According to a first aspect, the present invention is directed to a semiconductor device comprising a non-volatile memory device formed on a substrate, a first selection device formed on the substrate at one side of the non-volatile memory device, and a floating junction formed in the substrate between the non-volatile memory device and the first selection device. A gate of the first selection device is formed of a single-layered conductive layer.

In one embodiment, the non-volatile memory device comprises a stacked gate structure having a floating gate, a control gate, and an insulation layer formed between the floating gate and the control gate. In one embodiment, the floating gate of the non-volatile memory device and the gate of the first selection device are formed of the same material. In one embodiment, the device further comprises a drain formed in the substrate outside the non-volatile memory device opposite to the floating junction, and a source formed in the substrate outside the first selection device opposite to the floating junction. In one embodiment, the insulation layer of the non-volatile memory device comprises a silicon oxide layer, a silicon nitride layer, or a silicon oxide layer. In one embodiment, the device further comprises a spacer formed on one sidewall of the stacked gate structure in the non-volatile memory device adjacent to the gate of the first selection device, covering the floating junction and extending toward a sidewall of the gate in the first selection device. In one embodiment, the device further comprises a second spacer formed on the other sidewall in the gate of the first selection device opposite to the spacer, the spacer formed on the one sidewall of the non-volatile memory device having a height higher than that of the second spacer formed on the other sidewall. In one embodiment, a drain of the non-volatile memory device is connected to a bit line and a source of the selection device is electrically connected to a common source line. In one embodiment, the gate of the first selection device and the floating gate of the stacked gate structure of the non-volatile memory device are formed of the same material and have a substantially identical height. In one embodiment, the device further comprises an oxide layer between the spacer and the stacked gate structure of the non-volatile memory device. In one embodiment, the device further comprises: a second selection device formed on the substrate at the other side of the non-volatile memory device, and including a gate formed of a single-layered conductive layer; and a second floating junction formed on the substrate between the gate of the second selection device and the non-volatile memory device. In one embodiment, the device further comprises a first spacer formed on sidewalls of the stacked gate structure in the non-volatile memory device, covering the first and second floating junction; and a second spacer formed on a sidewall of the first and second selection devices having a height lower than that of the first spacer.

According to another aspect, the present invention is directed to a method of forming a semiconductor device comprising forming a first conductive layer pattern on a substrate, forming a stacked pattern including an inter-gate insulation layer pattern and a second conductive layer pattern on the first conductive layer pattern, forming a mask insulation layer pattern on the first conductive layer pattern spaced apart from the stacked pattern, removing the first conductive layer pattern outside the stacked pattern and the mask insulation layer pattern to form a floating gate below the stacked pattern and to form a selection gate below the mask insulation layer pattern, and forming a floating junction on the substrate between the floating gate and the selection gate.

In one embodiment, the forming of the mask insulation layer comprises: forming a spacer on at least one sidewall of the stacked pattern; forming the mask insulation layer pattern on the first conductive layer pattern exposed outside the spacer; and removing the spacer.

In one embodiment, the forming of the spacer on at least one sidewall of the stacked pattern comprises: forming an insulation layer for the spacer; forming a photoresist pattern exposing a sidewall of the stacked pattern with the spacer thereon; and etching the insulation layer for a spacer exposed by the photoresist pattern. In one embodiment, the forming of the spacer on at least one sidewall of the stacked pattern comprises: forming an insulation layer for the spacer; and etching the insulation layer for the spacer, and the spacer is formed on both sidewalls of the stacked pattern, the selection gate is formed on the substrate in both sides of the floating gate, the floating junction is formed between the floating gate and the selection gates on both sides of the floating gate. In one embodiment, the forming of the spacer on at least one sidewall of the stacked pattern comprises: forming an insulation layer for the spacer; etching the insulation layer for a spacer to form spacers on both sidewalls of the stacked pattern; forming a mask pattern covering one of the spacers and exposing another spacer; removing the spacer exposed by the mask pattern; and removing the mask pattern. In one embodiment, the method further comprises forming an oxide layer on the both sidewalls of the stacked pattern before the forming of the insulation for the spacer. In one embodiment, the insulation layer for the spacer is formed of a silicon nitride layer. In one embodiment, the method further comprises forming an oxide layer on the both sidewall of the stacked pattern before the forming the insulation layer for the spacer. In one embodiment, the mask insulation layer pattern is formed using a thermal oxidation process on the first conductive layer pattern exposed outside the spacer.

In one embodiment, the method further comprises: forming a spacer on the stacked pattern and the selection gate sidewall after the forming of the impurity junction; and forming a drain on a sidewall of the stacked pattern not adjacent to the floating junction, and a source on a sidewall of the selection gate not adjacent to the floating junction through an ion implantation process, and the spacer in a stacked gate sidewall adjacent to the floating junction covers the floating junction, and is extended toward the selection gate sidewall.

According to another aspect, the present invention is directed to a method of forming a semiconductor device comprises forming a conductive layer pattern on a substrate, forming a stacked pattern including an inter-layer insulation layer and a control gate on the conductive layer pattern, forming a spacer on at least one sidewall of the stacked pattern, forming a mask insulation layer pattern on the conductive layer pattern exposed outside of the spacer, removing the spacer, etching the conductive layer pattern outside the stacked pattern to form a floating gate below the stacked pattern and to form a selection gate below the mask insulation layer pattern, and performing an ion implantation process to form a floating junction on a substrate between the floating gate and the selection gate, and to form a source and a drain on the substrate outside the floating gate and the selection gate not adjacent to, for example, opposite to, the floating junction.

In one embodiment, the method further comprises forming an oxide layer on both sidewalls of the stacked pattern before the forming of the spacer. In one embodiment, the inter-layer insulation layer includes a silicon oxide layer, a silicon nitride layer, and a silicon oxide layer. In one embodiment, the forming of the mask insulation layer pattern comprises performing a thermal oxidation process on the conductive layer pattern exposed outside the spacer. In one embodiment, the spacer is formed on both sidewalls of the stacked pattern; the selection gate is formed on the substrate in both sides of the floating gate; and the floating junction region is formed between the floating gate and the selection gates in the both sides of the floating gate.

According to another aspect, the present invention is directed to a semiconductor device comprising a non-volatile memory device including a gate insulation layer, a floating gate, an inter-layer insulation layer, and a control gate on a substrate, a selection device formed at one side of the non-volatile memory device, a floating junction shared between the non-volatile memory device and the selection device, a first sidewall spacer formed on a sidewall of the non-volatile memory device, and a second sidewall spacer formed on a sidewall of the selection device and having a height lower than that of the first sidewall spacer.

In one embodiment, the selection device comprises a selection gate formed of a material identical to that of the floating gate of the memory device and having a height identical to that of the first sidewall spacer. In one embodiment, the non-volatile memory device and the selection device further comprise a source and a drain. In one embodiment, a drain of the non-volatile memory device is connected to the bit line and a source of the selection device is connected to a common source line. In one embodiment, the device further comprises another selection device connected electrically to the common source line, and another non-volatile memory device with a drain connected electrically to the bit line. In one embodiment, the device further comprises another selection device formed on the other side of the non-volatile memory device.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully with reference to the accompanying drawings, in which exemplary embodiments of the invention are shown. It will be understood that, although the terms first, second, third, and the like may be used herein to describe various regions, layers, and the like, these regions, layers, and the likes should not be limited by these terms. These terms are only used to distinguish one region, layer, and the like from another region, layer, and the like. Thus, a first layer mentioned in one embodiment could be termed a second layer in another embodiment without departing from the teachings of the present invention.

It will be also understood that when a layer (or pattern) is referred to as being "on" another layer or substrate, it can be directly on the other layer or substrate, or intervening layers may also be present.

In the specification 'a self-align method' may indicate that a layer is etched using a previously deposited material without an additional mask when the layer is patterned.

Figure 2:
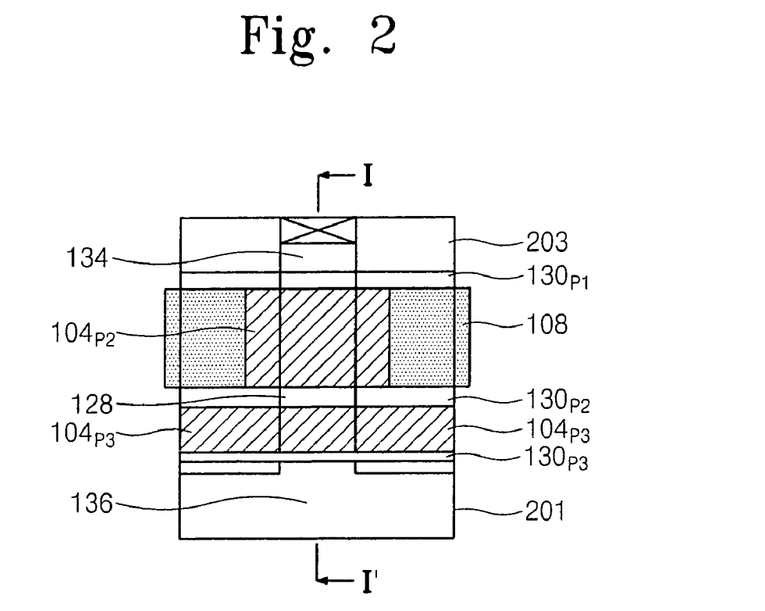
FIG. 2 is a plan view of a semiconductor device in which a unit memory cell includes one memory device and one selection device according to an exemplary embodiment of the present invention.
Figure 3:
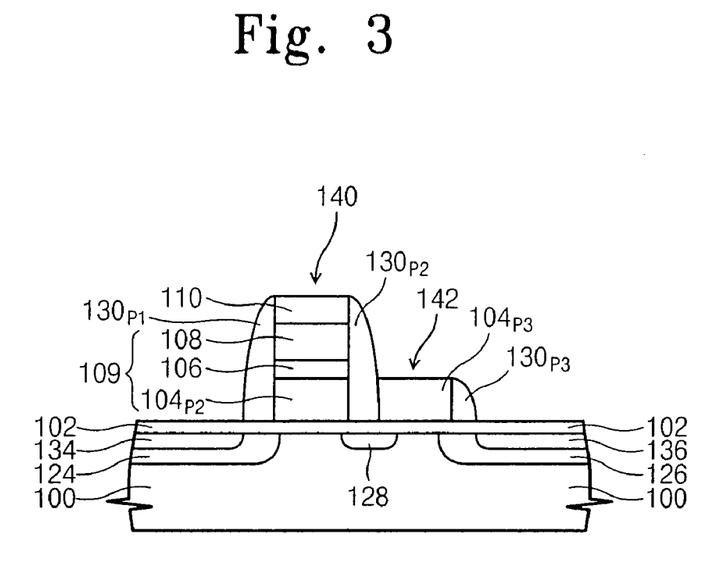
FIG. 3 is a sectional view taken along line I-I' of FIG. 2.

FIG. 2 is a plan view of a semiconductor device in which a unit memory cell includes one memory device and one selection device according to an exemplary embodiment of the preset invention. FIG. 3 is a sectional view taken along line I-I' of FIG. 2. In FIG. 2, reference numerals 201 and 203 represent an active region and a device isolation region, respectively.

Referring to FIGS. 2 and 3, a memory device 140 includes a stacked gate structure 109, and a first impurity diffusion region 134 (or drain region) formed in a substrate 100 at one side of the stacked gate structure 109. The stacked gate structure 109 of the memory device 140 includes a floating gate 104p2, an inter-gate insulation layer 106, and a control gate 108, which are sequentially stacked on the substrate 100 having a gate insulation layer 102 thereon. On the other hand, a selection device 142 is formed of the same material as the floating gate 104p2. The selection device 142 further includes a selection gate 104p3 with the same material and a substantially same thickness as the floating gate 104p2 and a second impurity diffusion region 136 (or source region) formed in the substrate 100 at one side of the selection gate 104p3. In terms of manufacturing processes, the selection gate 104p3 of the selection device 142 is formed concurrently when the floating gate 104p2 of the memory device 140 is formed. Depending on a bottom structure or within an allowable variation in processes, the height of the selection gate 104p3 may be different from that of the floating gate 104p2. The stacked gate structure 109 of the memory device 140, and the selection gate 104p3 of the selection device 142 are spaced apart from each other. The distance therebetween can be determined by a spacer process, and have a width narrower than the minimum distance that can be defined by photolithography. Additionally, the distance between the stacked gate structure 109 and the selection gate 104p3 will be described in more detail with reference to FIGS. 6 to 14.

Spacers 130p1, 130p2, and 130p3 are disposed on sidewalls of the stacked gate structure 109 and the selection gate 104p3. The spacer 130p1 and the spacer 130p3 are respectively disposed on one sidewall of the stacked gate structure 109 and one sidewall of the selection gate 104p3 opposite to each other. The spacer 130p2 is disposed on the other sidewall of the stacked gate structure 109, and also extended toward the other sidewall of the selection gate 104p3. That is, the spacer 130p2 is disposed between the other sidewall of the stacked gate structure 109 and the other sidewall of the selection gate 104p3. The spacer 130p2 is disposed in the space between the stacked gate structure 109 and the selection gate 104p3. Thus, the spaced distance between the stacked gate structure 109 and the selection gate 104p3 can be determined by the width of the spacer 130p2. The spacers 130p1 and 13-p2 on the one and the other sidewalls of the stacked gate structure 109 have a height higher than that of the spacer 130p3 on the sidewall of the selection gate 104p3. The floating junction 128 connecting the memory device 140 and the selection device 142 is formed on the substrate 100 between the stacked gate structure 109 and the selection gate 104p3. The floating junction 128 is disposed below the spacer 130p2. A first high concentration impurity region 134 serving as a drain region of the memory device 140 is formed on the substrate 100 outside the spacer 130p1 on one sidewall of the stacked gate structure 109. A second high concentration second impurity region 136 serving as a source region of the selection device 142 is formed on the substrate 100 outside the spacer 130p3 on the other sidewall of the selection gate 104p3. The first and second high concentration impurity region 134 and 136 serve as a drain and source of the unit memory cell. To reduce the short channel effect, a first low concentration impurity region 124 is additionally disposed on the substrate 100 outside the stacked gate structure 109, and also a second low concentration impurity region 126 is additionally disposed on the substrate 100 outside the selection gate 130p3. The substrate 100 can be formed of a semiconductor silicon substrate or an organic compound that can be conductive using impurity.

A hard mask 110 can be additionally disposed on the control gate 108 of the stacked gate structure 109. Additionally, an insulation layer can be additionally disposed between the stacked gate structure 109 and the spacers 130p1 and 130p2 on the both sidewalls. Likewise, an insulation layer can be additionally disposed between the selection gate 130p3 and the spacer 130p3 on the one sidewall of the selection gate 130p3.

Figure 4:
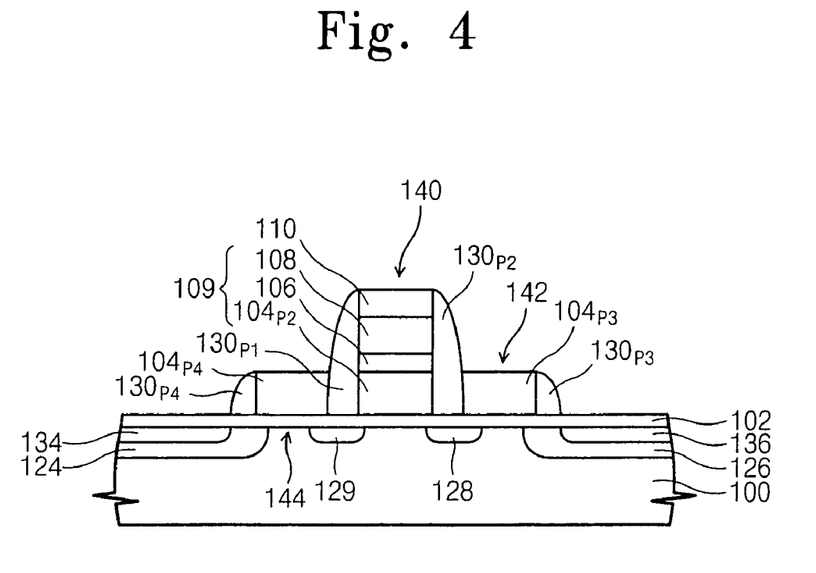
FIG. 4 is a sectional view of a semiconductor device in which a unit memory cell includes two memory devices and one selection device according to an exemplary embodiment of the present invention.

FIG. 4 is a sectional view of a semiconductor device in which a unit memory cell includes two memory devices and one selection device. Unlike the selection device of FIG. 3, the unit memory cell of FIG. 4 includes the two selection devices. Referring to FIG. 4, a memory device 140 is disposed between a first selection device 142 and a second selection device 144. Moreover, the first selection device 142 and the second selection device 144 can be symmetrically disposed on both sides of the memory device 140. The stacked gate structure of the memory device 140 and the selection gate structures of the selection devices 142 and 144 are identical to those of the semiconductor device as illustrated in FIGS. 2 and 3. The spacers 130p1 and 130p2 are disposed on both sides of the stacked gate structure 109 in the memory device 140. Additionally, the selection gate 104p4 of the second selection device 144 and the selection gate 104p3 of the first selection device 142 are, respectively, adjacent to the spacer 130p1 and the spacer 130p2. A first floating junction 128 and a second floating junction 129 are, respectively, disposed between the stacked gate structure 109 and the selection gates 104p3 and 104p4. The spacer 130p3 is disposed on a sidewall of the selection gate 104p3 in the first selection device 142. The spacer 130p4 is disposed on a sidewall of the selection gate 104p4 in the second selection device 144. High concentration impurity regions 134 and 136 serving as a source and a drain of the unit memory cell, respectively, are disposed on the substrate 100 outside the spacer 130p4 and the spacer 130p3. To reduce a short channel effect, low concentration impurity regions 124 and 126 are additionally formed below the spacer 130p4 and 130p3.

Figure 5:
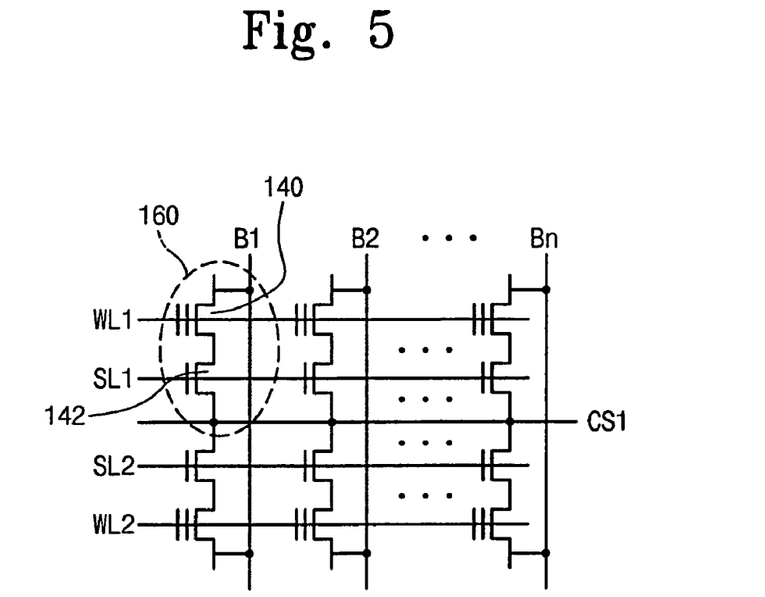
FIG. 5 is a circuit diagram of a memory array with a non-volatile memory device and a selection device according to an exemplary embodiment of the present invention.

FIG. 5 is a circuit diagram of a memory array with a non-volatile memory device and a selection device. Referring to FIG. 5, a unit cell 160 includes one non-volatile memory device 140 and one selection device 142. A memory array of the unit cells constitutes an EEPROM. Specifically, FIG. 5 is a circuit diagram of an exemplary byte erasable EEPROM. In more detail, bit lines B1 to Bn are electrically connected to drains of the non-volatile memory device 140. Sources of the selection device 142 are connected to a common source CS1. In a case of non-volatile memory device 140 and the first and second selection devices 142 and 144 in FIG. 4, the impurity junction region 134 (drain) of the second selection device 144 is connected to bit lines B1 to Bn. The impurity junction region 136 (source) of the first selection device 142 is connected to the common source CS1. It is apparent for those in the art that the non-volatile memory devices 140 are electrically connected through the first and second floating junctions 128 and 129 between the first and second selection devices 142 and 144. The memory devices 140 in a column are electrically connected to an identical word line WL, and also the selection devices in a column are electrically connected to selection line SL. Here, the control gate of the memory device can serve as a word line, and also the selection gate of the selection device can serve as a select line. A unit cell including one non-volatile memory device and one selection device will be described in more detail. However, it is apparent for those in the art that a method of forming a unit cell of FIG. 4 with one non-volatile memory device and two selection devices is clear with reference to FIGS. 6 to 14.

Figure 6:
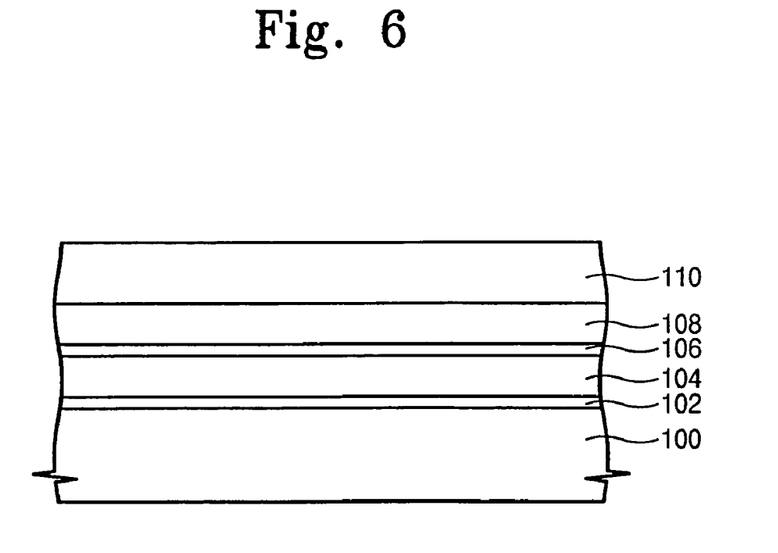
FIGS. 6 to 14 are sectional views illustrating a method of forming the semiconductor device of FIG. 3 according to an exemplary embodiment of the present invention.

Referring to FIG. 6, a gate insulation layer 102 (e.g., a silicon oxide layer, a silicon nitride layer, combinations of the silicon oxide layer and the silicon nitride layer, etc.) is formed on the substrate 100 (e.g., a silicon substrate). A first conductive layer 104 used as a floating gate is formed on the gate insulation layer 102. An inter-gate insulation layer 106 (e.g., a silicon oxide layer/silicon nitride layer/silicon oxide layer (ONO)) is formed on the resultant structure. The first conductive layer 104 can be formed of a polysilicon, and is patterned to be separated from adjacent memory cells in a word line direction. A second conductive layer 108 used as a control gate (word line) is formed on the inter-gate insulation layer 106. The second conductive layer 108 can be formed of a polysilicon. Additionally, the second conductive layer 108 can be formed of combinations of a polysilicon and a low-resistivity metal. A capping insulation layer 110 such as a silicon oxide layer is formed on the second conductive layer 108. The substrate 100 can be an N-type or a P-type. A well can be formed by ion-injecting an N-type impurity with about 1.0 to 1.5 Me Volt. The gate insulation layer 102 can be formed with a thickness of 60 to 80 Å. The first conductive layer 104 and the second conductive layer 108 can be formed with a thickness of about 1500 Å.

Figure 7:
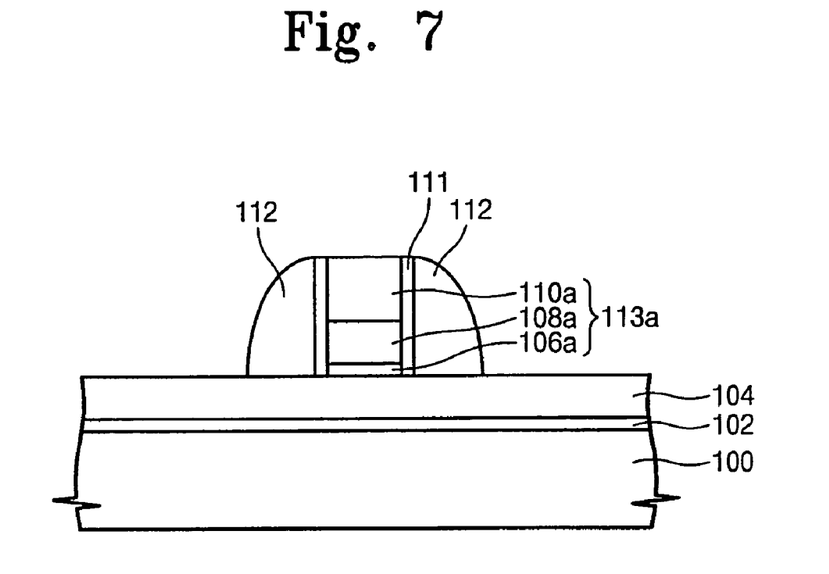

Referring to FIG. 7, the capping insulation layer 110, the second conductive layer 108, and the inter-gate insulation layer 106 are patterned until the first conductive layer 104 is exposed to form a capping insulation layer pattern 110a, a second conductive layer pattern 108a, and an inter-gate insulation layer pattern 106a on the capping insulation layer 110 by a photolithography and an etching process using a photoresist. The second conductive layer pattern 108a serves as a control gate (or a word line) of the memory device. Hereinafter, for convenience of description, a sequentially stacked inter-gate insulation layer pattern 106a, a second conductive layer pattern 108a, and an optional capping insulation layer pattern 110a structure will be referred to as a top stacked pattern 113a. A silicon oxide layer 111 is formed with a thickness of about 2000 to 3000 Å on sidewalls of the top stacked pattern 113a. A silicon nitride layer is formed with a thickness of about 2000 to 3000 Å, and then a sidewall spacer 112 of the silicon nitride layer is formed on both sidewalls of the top stacked pattern 113a by performing an etching process.

Figure 8:
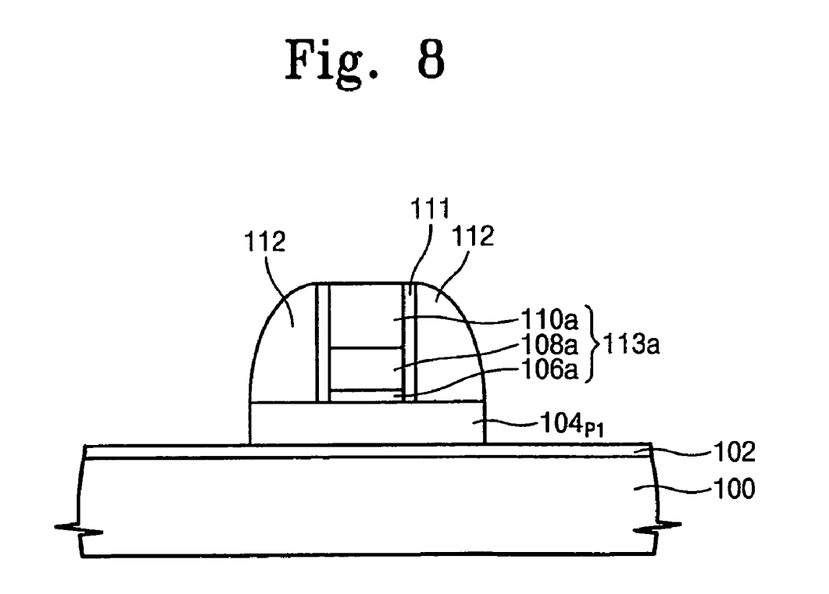

Referring to FIG. 8, using the sidewall spacer 112 as an etching mask, the first conductive layer 104 on both sides of the top stacked pattern 113a is etched to from a first conductive layer pattern 104p1. The first conductive layer pattern 104p1 can be used as a material for a floating gate of the memory device and a selection gate of the selection device.

Figure 9:
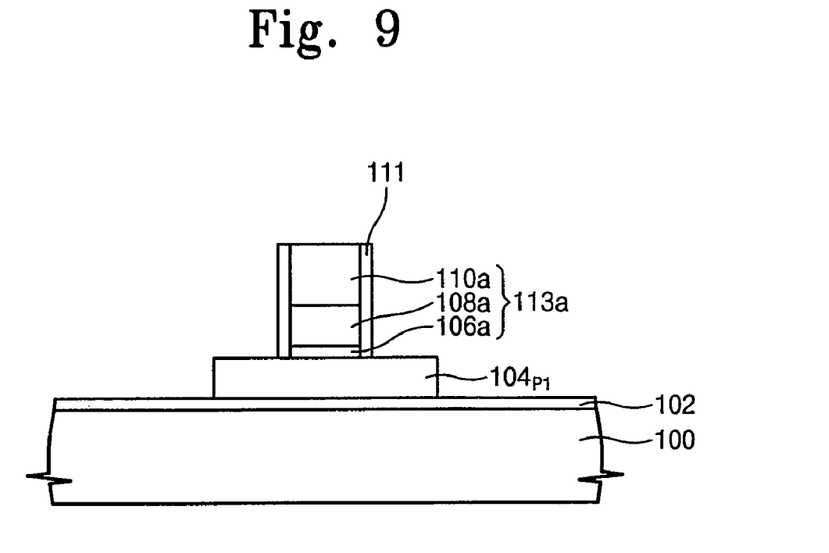

Referring to FIG. 9, the sidewall spacer 112 is removed. The removing of the sidewall spacer 112 can be performed using a wet etching method. Here, the silicon oxide layer 111 prevents a nitride layer of the inter-gate insulation layer from being etched during the removing of the sidewall spacer 112.

Figure 10:
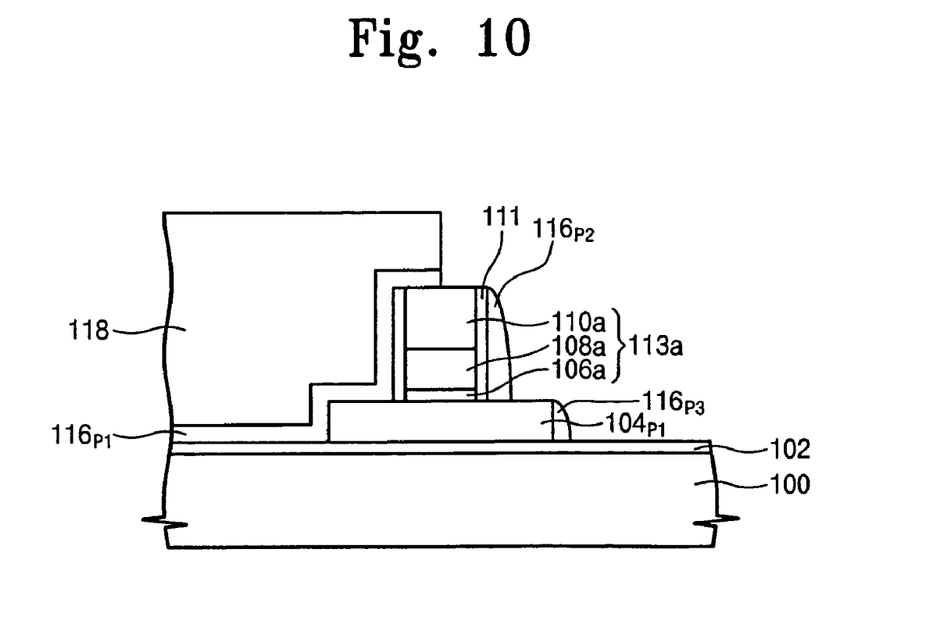

Referring to FIG. 10, a spacer 116p2 is formed on one sidewall of the top stacked pattern 113a such that a portion of the first conductive layer pattern 104p1 is exposed at one side of the top stacked pattern 113a. The spacer 116p2 can be formed of a silicon nitride layer. In more detail, the silicon nitride layer having a thickness of 400 to 600 Å is formed, and then a photoresist is applied to an entire surface of the silicon nitride layer. The photoresist forms a photoresist pattern 118 using a photolithography and an etching process. The photoresist pattern 118 is formed to expose one sidewall and cover the other sidewall of the top stacked pattern 113a. An etching process is performed on the silicon nitride layer exposed by the photoresist pattern 118 to form a spacer 116p2 on one sidewall of the top stacked pattern 113a. At this point, the first conductive layer pattern 104p1 outside the spacer 116p2 is exposed, and then a spacer 116p3 is formed on a sidewall of the first conductive layer pattern 104p1. The spaced distance between the stacked gate structure of the memory device and the selection gate of the selection device is determined by the width of the spacer 116p2 in one sidewall of the top stacked pattern 113a. This spaced distance is narrower than the minimum distance that can be formed by photolithography.

Figure 11:
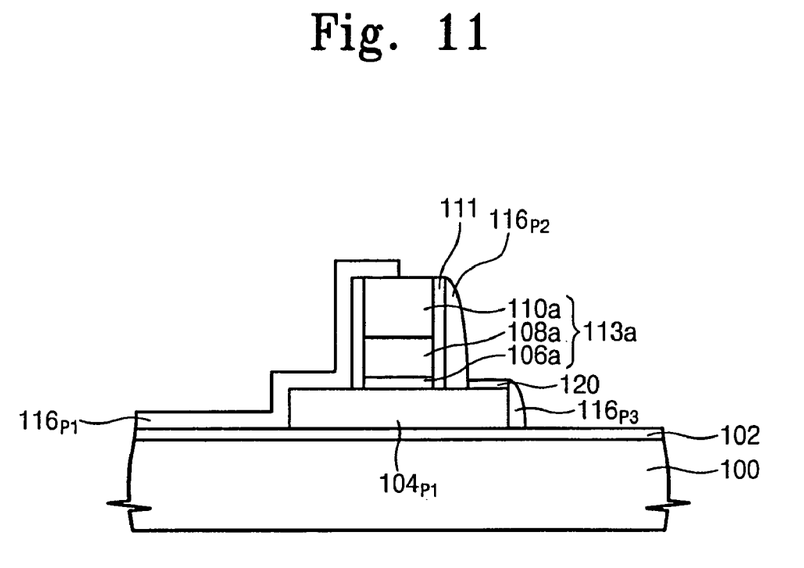

Referring to FIG. 11, after removing the photoresist pattern 118, an oxide layer pattern 120 is formed on the first conductive layer pattern 104p1 exposed outside the spacer 116p2 of the top stacked pattern 113a. The oxidation pattern 120 is formed in a self-align method in the presence of the spacer 116p2 to define a selection gate for the selection device. For example, the oxide layer pattern 120 can be formed with a thickness of about 100 to 200 Å by a thermal oxidation process.

Herein, in order to form a memory device with one non-volatile memory device and two selection devices, an etching for the silicon nitride layer is performed to form spacers on both sidewalls of the top stacked pattern 113a without forming the photoresist pattern 118, which will be described in more detail with reference to FIGS. 15 to 18.

Figure 12:
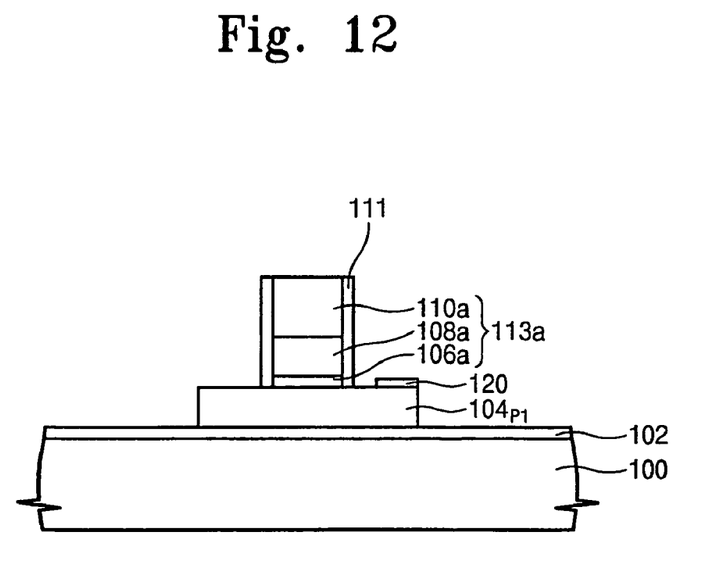

Referring to FIG. 12, the spacers 116p2 and 116p3 and a remaining silicon nitride layer 116p1 are removed through a wet etching process that makes use of a different etching speed.

Figure 13:
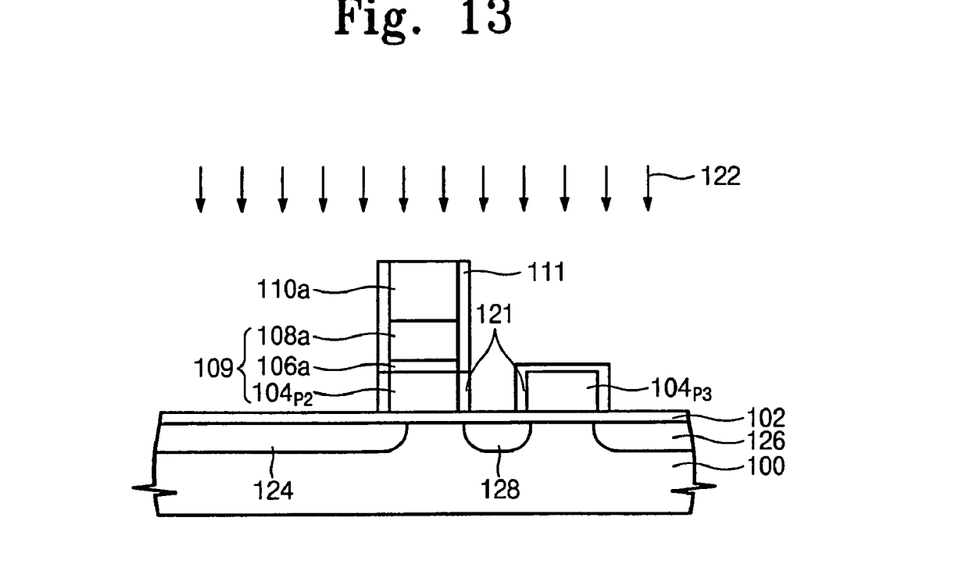

Referring to FIG. 13, using the capping insulation layer 110a and the oxide layer pattern 120 as an etching mask, the exposed first conductive layer pattern 104p1 is etched to form the floating gate 104p2 of the memory device and the selection gate 104p3 of the selection device. Therefore, the stacked gate structure 109 of the memory device including the floating gate 104p3, the inter-gate insulation layer pattern 106a, and the second conductive layer pattern 108a is formed, and also the selection gate 104p3 of the selection device is formed. By a thermal oxidation process, a silicon oxide layer 121 is formed on both sidewalls of the floating gate 104p2 and both sidewalls of the selection gate 104p3. Low concentration source and drain 124 and 126 of a unit memory cell are formed in about $1E^{17-18}$ ions/cm$^3$ by ion-injecting N-type impurity (e.g., P 122). At this point, a floating junction 128 is formed on the substrate 100 between the stacked gate structure 109 and the selection gate 104p3.

Figure 14:
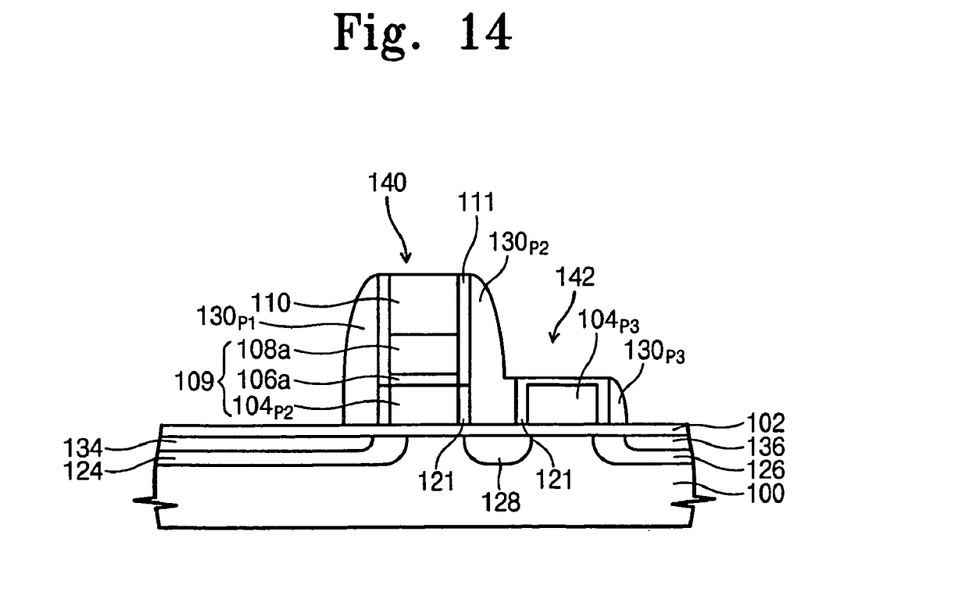

Referring to FIG. 14, an insulation layer such as a silicon oxide layer and a silicon nitride layer is applied using a chemical vapor deposition (CVD) method. The insulation layer is etched to form spacer 130p1 and 130p2 on both sidewalls of the stacked gate structure 109, and to form a spacer 130p3 on the other sidewall of the selection gate 104p3. The spacer 130p2 in one sidewall of the stacked gate structure 109 is extended toward one sidewall of the selection gate 104p3 to protect a bottom floating junction 128. High concentration source and drain 134 and 136 of a unit memory cell are formed in about $1E^{19-20}$ ions/cm$^3$ by ion-injecting N-type impurity (e.g., P 132). A high concentration drain 134 is formed on the substrate 100 outside the spacer 130p1 in the other sidewall of the stacked gate structure 109. A high concentration source 136 is formed on the substrate 100 outside the spacer 130p3 in the other sidewall of the selection gate 104p3. At this point, the floating junction 128 is protected from impurity injections for high concentration source and drain. When the concentration of the floating junction 129 is too high, short channel effect can occur in the device. The concentration of a well (not shown) having the non-volatile memory device 140 and the selection device 142 can be about $1E^{16-17}$ ions/cm$^3$.

Figure 15:
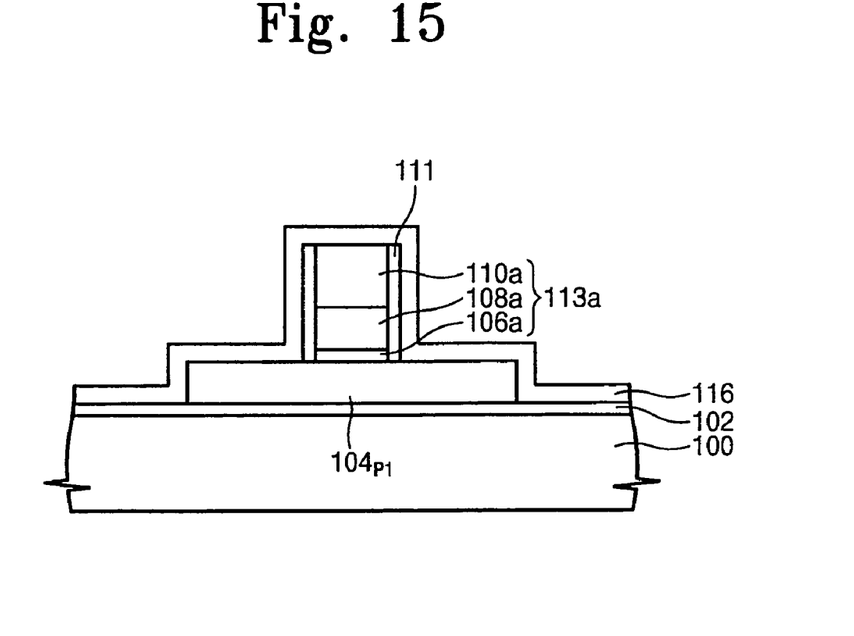
FIGS. 15 to 18 are sectional views illustrating a method of forming the semiconductor device of FIG. 4 according to an exemplary embodiment of the present invention.

A method of forming a semiconductor device including a unit memory cell with one memory device and two selection devices will be described in more detail with reference to FIGS. 15 to 18. After forming the top stacked pattern 113a and the first conductive layer pattern 104p1 by performing the processes of FIGS. 6 to 9, a silicon nitride layer 116 is formed as illustrated in FIG. 15.

Figure 16:
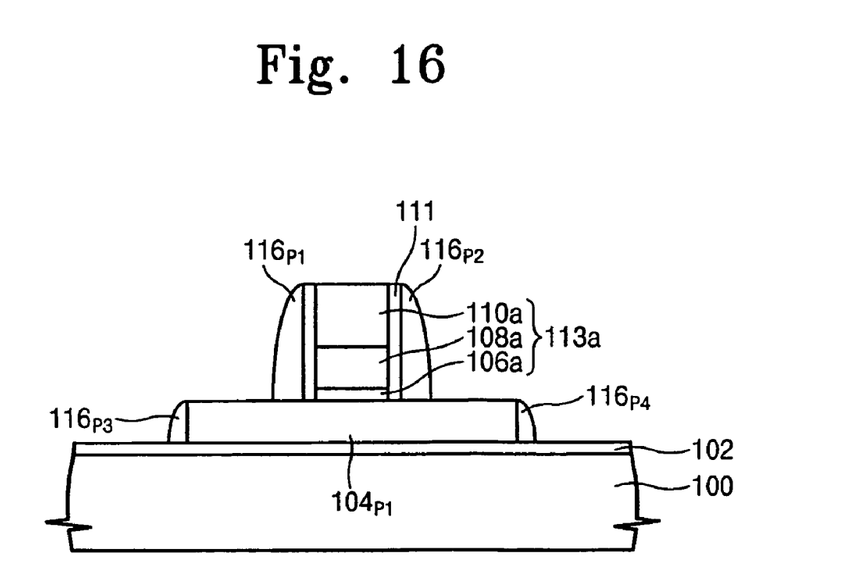

Referring to FIG. 16, an etching process for the silicon nitride layer 116 is performed to form spacers 116p1 and 116p2 on both sidewalls of the top stacked pattern 113a, and spacers 116p3 and 116p4 on both sidewalls of the first conductive layer pattern 104p1. A spaced distance between the memory device and the selection device is determined by the width of the spacers 116p1 and 116p2 on a sidewall of the top stacked pattern 113a.

Figure 17:
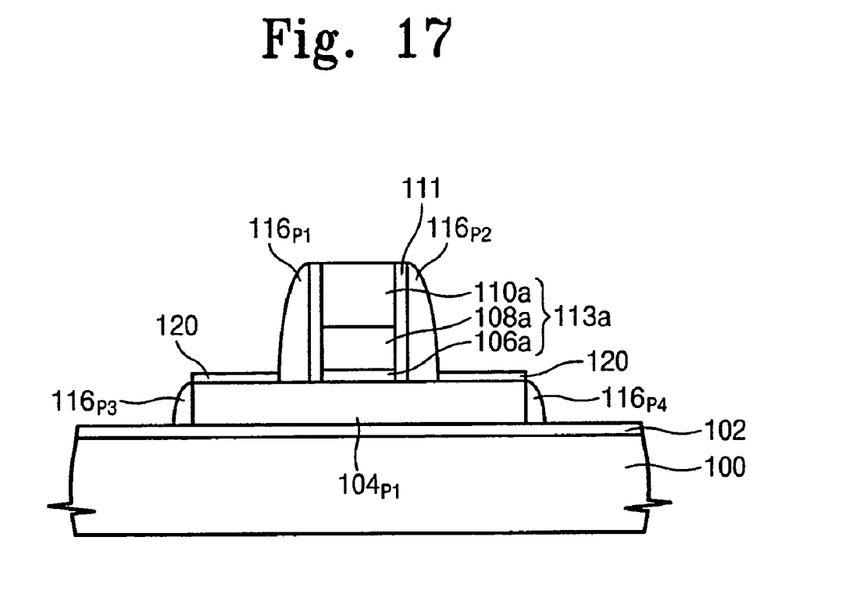

Referring to FIG. 17, an oxide layer pattern 120 is formed on the first conductive layer pattern outside the spacer 116p1 and 116p2. The oxide layer pattern 120 can be formed by a thermal oxidation process.

Figure 18:
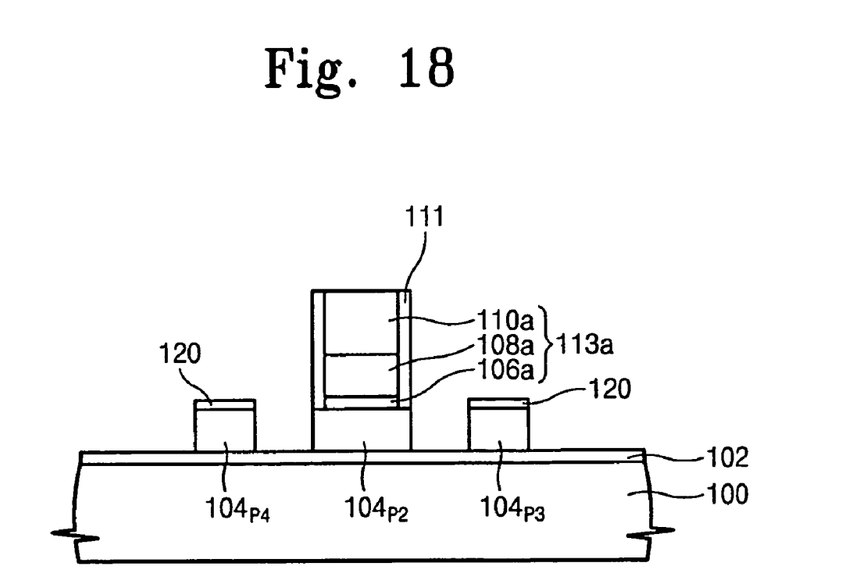

Referring to FIG. 18, after removing the spacers 116p1 to 116p4, using the capping insulation layer pattern 110a and the oxide layer pattern 120 as an etching mask, the first conductive layer pattern exposed by the removing of the spacers 116p1 and 116p2 is etched to form the floating gate 104p2 of the memory device, and first and second selection gates 104p3 and 104p4 of the first and second selection devices on both sides of the floating gate 104p2.

A semiconductor device having a unit memory cell with one memory device and two selection devices of FIG. 5 is formed by performing the processes (e.g., an ion-implantation process, and a spacer process) of FIGS. 13 and 14.

After forming the spacers 116p1 to 116p4, in case a mask pattern covering the one spacer on sidewalls of the top stacked structure 109 is formed and then a thermal oxidation process is performed, the semiconductor device including a unit memory cell with one memory device and one selection device will be formed. This will be described in more detail with reference to FIGS. 19 to 21.

Figure 19:
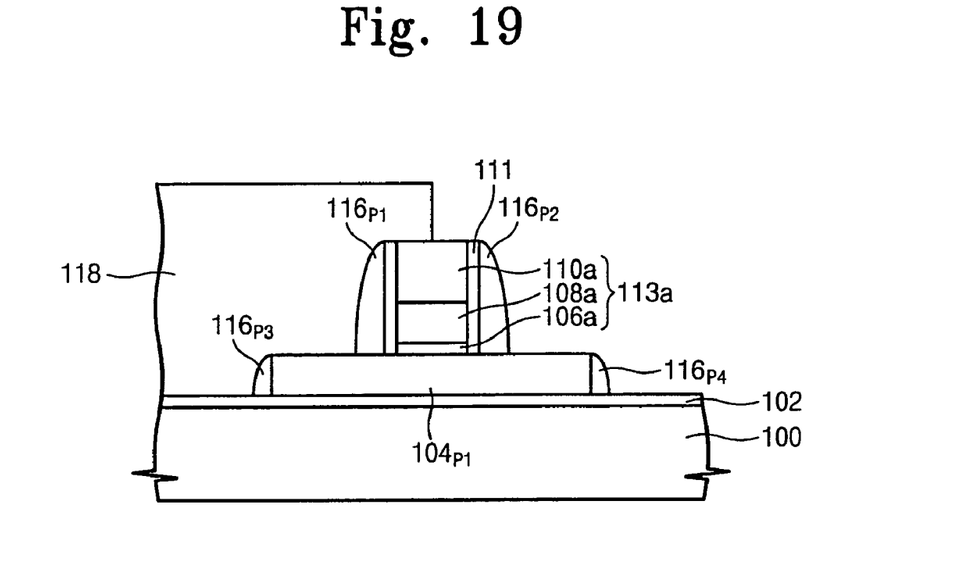
FIGS. 19 to 21 are sectional views illustrating a method of forming the semiconductor device of FIG. 3 according to an exemplary embodiment of the present invention.

As illustrated in FIG. 19, after forming spacers 116p1 to 116p4 on the both sidewalls of the top stacked structure 113a and the both sidewalls of the first conductive layer pattern 104p2, a mask pattern 118 covering the spacer 116p1 on the other sidewall of the top stacked pattern 113a and the spacer 116p3 on the first conductive layer pattern 104p1 is formed. The mask pattern 118 can be formed through exposing and developing processes after applying the photoresist.

Figure 20:
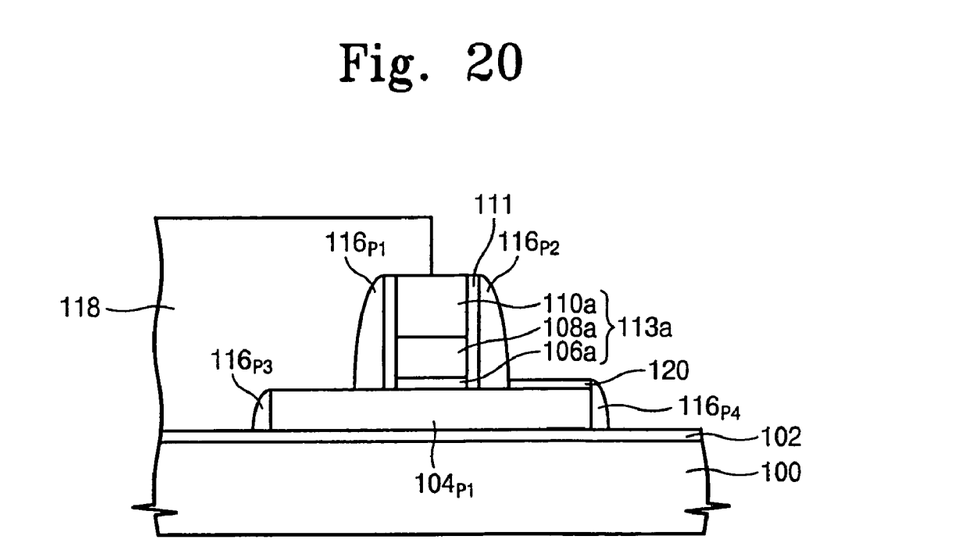

Referring to FIG. 20, an oxidation layer pattern 120 is formed on the first conductive pattern outside the spacer 116p2 in one sidewall of the top stacked pattern 113a by a thermal oxidation process.

Figure 21:
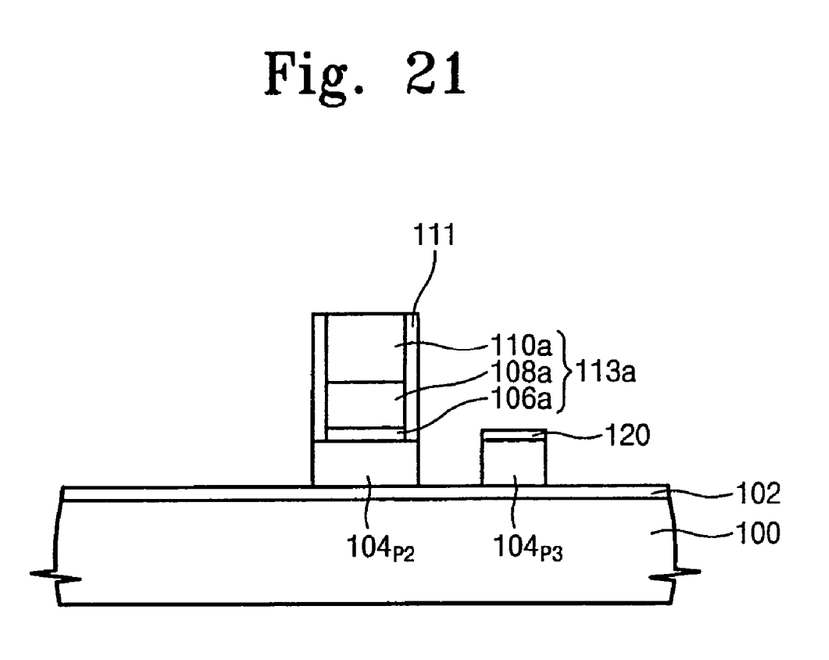

Referring to FIG. 21, after removing the mask pattern 118 and the spacers 116p1 to 116p4, the exposed first conductive layer pattern is etched to form the floating gate 104p2 of the memory device and the selection gate 104p3 of the selection device using the capping insulation pattern 110a and the oxidation layer pattern 120 of the top stacked pattern as an etching mask.

According to the present invention, there are provided a semiconductor device having a small-sized chip, and a method of forming the same.

Additionally, there are provided a semiconductor device including a small-sized unit cell with one stacked structure non-volatile memory device and at least one selection device, and a method of forming the same.

Moreover, there are provided an EEPROM having a unit cell formed by separating the floating gate of the non-volatile memory device from the gate of the selection device in a self-alignment by a selectively formed layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor device comprising:
   a non-volatile memory device formed on a substrate, the non-volatile memory device comprising a stacked gate structure having a floating gate, a control gate, and an insulation layer formed between the floating gate and the control gate;

a first selection device formed on the substrate at one side of the non-volatile memory device;

a floating junction formed in the substrate between the non-volatile memory device and the first selection device; and a spacer formed on one sidewall of the stacked gate structure in the non-volatile memory device adjacent to a gate of the first selection device, the spacer completely covering the floating junction between the non-volatile memory device and the first selection device and extending toward a sidewall of the gate in the first selection device;

wherein the gate of the first selection device is formed of a single-layered conductive layer.

2. The semiconductor device of claim 1, wherein the floating gate of the non-volatile memory device and the gate of the first selection device are formed of the same material.

3. The semiconductor device of claim 1, further comprising a drain formed in the substrate outside the non-volatile memory device opposite to the floating junction, and a source formed in the substrate outside the first selection device opposite to the floating junction.

4. The semiconductor device of claim 1, wherein the insulation layer of the non-volatile memory device comprises silicon oxide layer/silicon nitride layer/silicon oxide layer (ONO).

5. The semiconductor device of claim 1, further comprising a second spacer formed on the other sidewall in the gate of the first selection device opposite to the spacer, the spacer formed on the one sidewall of the non-volatile memory device having a height higher than that of the second spacer formed on the other sidewall.

6. The semiconductor device of claim 1, wherein a drain of the non-volatile memory device is connected to a bit line and a source of the selection device is electrically connected to a common source line.

7. The semiconductor device of claim 6, wherein the gate of the first selection device and the floating gate of the stacked gate structure of the non-volatile memory device are formed of the same material and have a substantially identical height.

8. The semiconductor device of claim 1, further comprising an oxide layer between the spacer and the stacked gate structure of the non-volatile memory device.

9. The semiconductor device of claim 1, further comprising:

a second selection device formed on the substrate at the other side of the non-volatile memory device, and including a gate formed of a single-layered conductive layer; and a second floating junction formed on the substrate between the gate of the second selection device and the non-volatile memory device.

10. The semiconductor device of claim 9, further comprising a first spacer formed on sidewalls of the stacked gate structure in the non-volatile memory device, covering the first and second floating junction; and a second spacer formed on a sidewall of the first and second selection devices having a height lower than that of the first spacer.

11. A semiconductor device comprising:

a non-volatile memory device including a gate insulation layer, a floating gate, an inter-layer insulation layer, and a control gate on a substrate;

a selection device formed at one side of the non-volatile memory device;

a floating junction shared between the non-volatile memory device and the selection device;

a first sidewall spacer formed on a sidewall of the non-volatile memory device adjacent to the selection device, the first sidewall spacer completely covering the floating junction between the non-volatile memory device and the selection device and extending toward a sidewall of the selection device; and a second sidewall spacer formed on the other sidewall of the selection device, and having a height lower than that of the first sidewall spacer.

12. The semiconductor device of claim 11, wherein the selection device comprises a selection gate formed of a material and having a height identical to that of the floating gate of the non-volatile memory device.

13. The semiconductor device of claim 11, wherein the non-volatile memory device and the selection device further comprise a source and a drain.

14. The semiconductor device of claim 12, wherein a drain of the non-volatile memory device is connected to the bit line and a source of the selection device is connected to a common source line.

15. The semiconductor device of claim 13, further comprising another selection device connected electrically to the common source line, and another non-volatile memory device with a drain connected electrically to the bit line.

16. The semiconductor device of claim 14, further comprising another selection device formed on the other side of the non-volatile memory device.

* * * * *